(12) United States Patent
Hwan (10) Patent No.: US 9,105,814 B2
(45) Date of Patent: Aug. 11, 2015

(54) LIGHT EMITTING DIODE AND METHOD OF THE SAME

(76) Inventor: Lu-Chen Hwan, Taipei (TW)

( * ) Notice: Subject to any disclaimer, the term of this patent is extended or adjusted under 35 U.S.C. 154(b) by 438 days.

(21) Appl. No.: 12/504,406

(22) Filed: Jul. 16, 2009

(65) Prior Publication Data

US 2010/0012963 A1    Jan. 21, 2010

(30) Foreign Application Priority Data

Jul. 21, 2008    (TW) ............................... 97127580 A (51) Int. Cl.

| | |
|---|---|
| *H01L 33/38* | (2010.01) |
| *H01L 23/00* | (2006.01) |
| H01L 33/08 | (2010.01) |
| H01L 33/44 | (2010.01) |
| H01L 33/62 | (2010.01) |

(52) U.S. Cl.
CPC .............. *H01L 33/382* (2013.01); *H01L 24/17* (2013.01); *H01L 33/08* (2013.01); *H01L 33/44* (2013.01); *H01L 33/62* (2013.01); *H01L 2224/48091* (2013.01); *H01L 2224/49107* (2013.01); *H01L 2924/12041* (2013.01)

(58) Field of Classification Search
CPC .................................................... H01L 33/382
USPC ......... 257/79, 81, 99, E33.062, E33.065, 778
See application file for complete search history.

(56) References Cited

U.S. PATENT DOCUMENTS

| | | | |
|---|---|---|---|
| 2002/0017727 A1* | 2/2002 | Uemura ........................ | 257/778 |
| 2008/0096297 A1* | 4/2008 | Schiaffino et al. ............. | 438/22 |
| 2010/0012963 A1* | 1/2010 | Hwan ............................ | 257/98 |

* cited by examiner

Primary Examiner — Yu-Hsi D Sun
(74) Attorney, Agent, or Firm — Snell & Wilmer L.L.P.

(57) ABSTRACT

A light emitting diode and a method of the same are provided. The light emitting diode includes a substrate with a first region and a second region, a first semiconductor layer, a light-emitting layer, and a second semiconductor layer. The light emitting diode further includes a plurality of vias, a first metal layer, a second metal layer, and a patterned passivation layer interposed between the second semiconductor layer and the first metal layer. The plurality of vias are located in the first region and penetrate through the second semiconductor layer and the light-emitting layer to expose part of the first semiconductor layer. The first metal layer is located in the first region, and electrically contacted with the first semiconductor layer through the plurality of vias. The second metal layer is located in the second region, and electrically contacted with the second semiconductor layer and electrically insulated from the first metal layer. The patterned passivation layer is configured to electrically isolate the first metal layer from the second semiconductor layer and the light-emitting layer.

8 Claims, 8 Drawing Sheets

LIGHT EMITTING DIODE AND METHOD OF THE SAME

CROSS REFERENCE TO RELATED APPLICATIONS

This application claims priority to Taiwan Patent Application No. 097127580 entitled "LIGHT EMITTING DIODE AND METHOD OF THE SAME", filed on Jul. 21, 2008, which is incorporated herein by reference and assigned to the assignee herein.

FIELD OF INVENTION

The invention is related to a light emitting diode and a method of the same, especially to a light emitting diode having improved luminous efficiency and a method of the same.

BACKGROUND OF THE INVENTION

Due to the advantages of low production cost, simple structure, low power consumption, small size, and ease of assembly, the light emitting diode (LED) has been widely applied in various fields.

Figure 1:
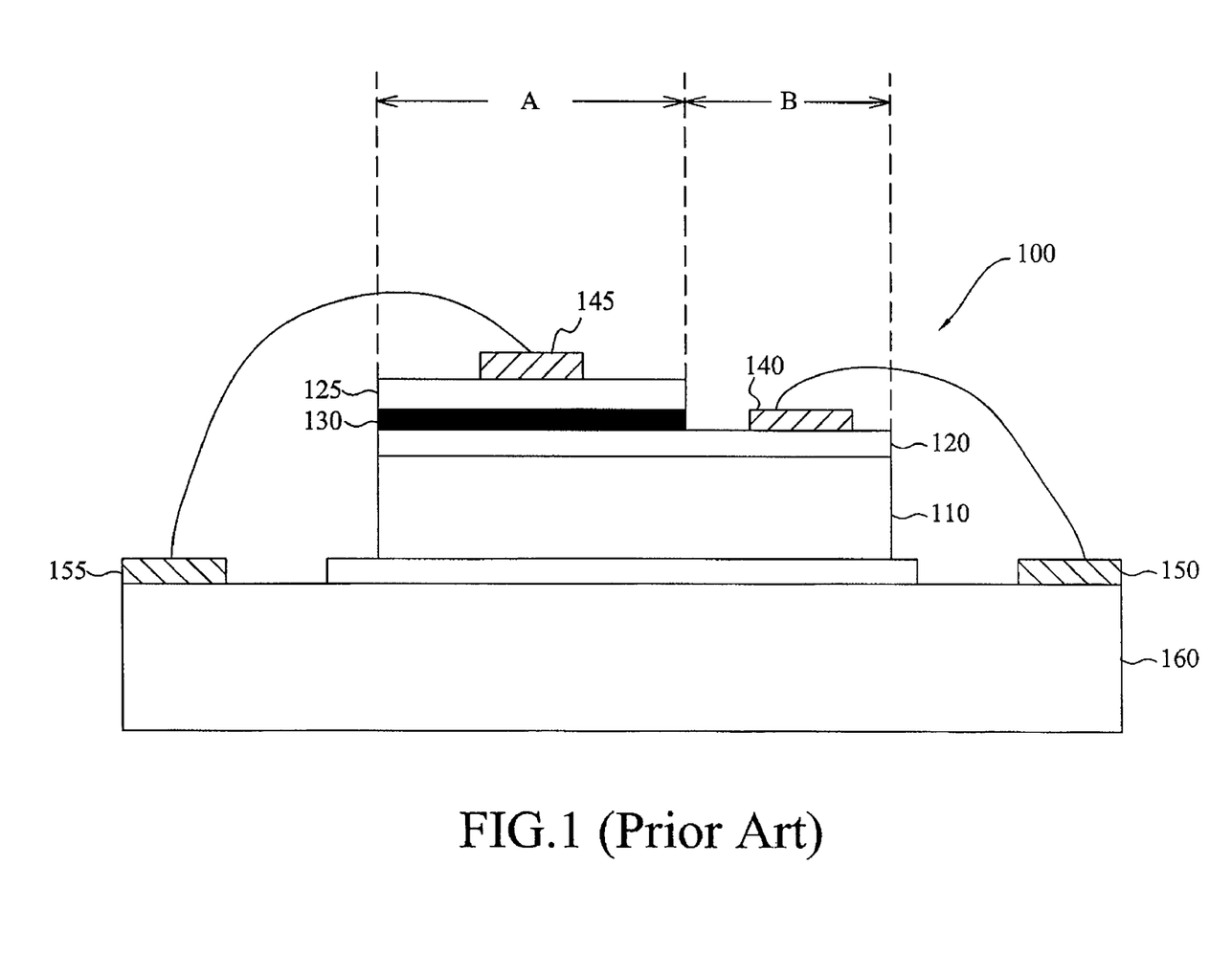
FIG. 1 is a cross-sectional diagram of a light emitting diode packaged by known wire bonding.

FIG. 1 is a cross-sectional diagram of a light emitting diode 100 packaged by conventional wire bonding technique. The light emitting diode 100 includes a substrate 110, a N-type semiconductor layer 120, a light-emitting layer 130, a P-type semiconductor layer 125, and electrodes 140 and 145 contacted with the N-type semiconductor layer 120 and P-type semiconductor layer 125 respectively. The light emitting diode 100 is mounted on a packaged base 160, and the electrodes 140 and 145 of the light emitting diode 100 are electrically connected to conductive regions 150 and 155 of the packaged base 160 respectively.

Referring to FIG. 1, the light emitting diode 100 includes an illuminating region A (i.e. the region covering the light-emitting region 130) and a non-illuminating region B (i.e. the region not covering the light-emitting region 130). However, the electrode 145 screens out part of the light generated from the light-emitting region 130 in the illuminating region A, such that the intensity of the outputted light from the light emitting diode 100 will be reduced.

Figure 2:
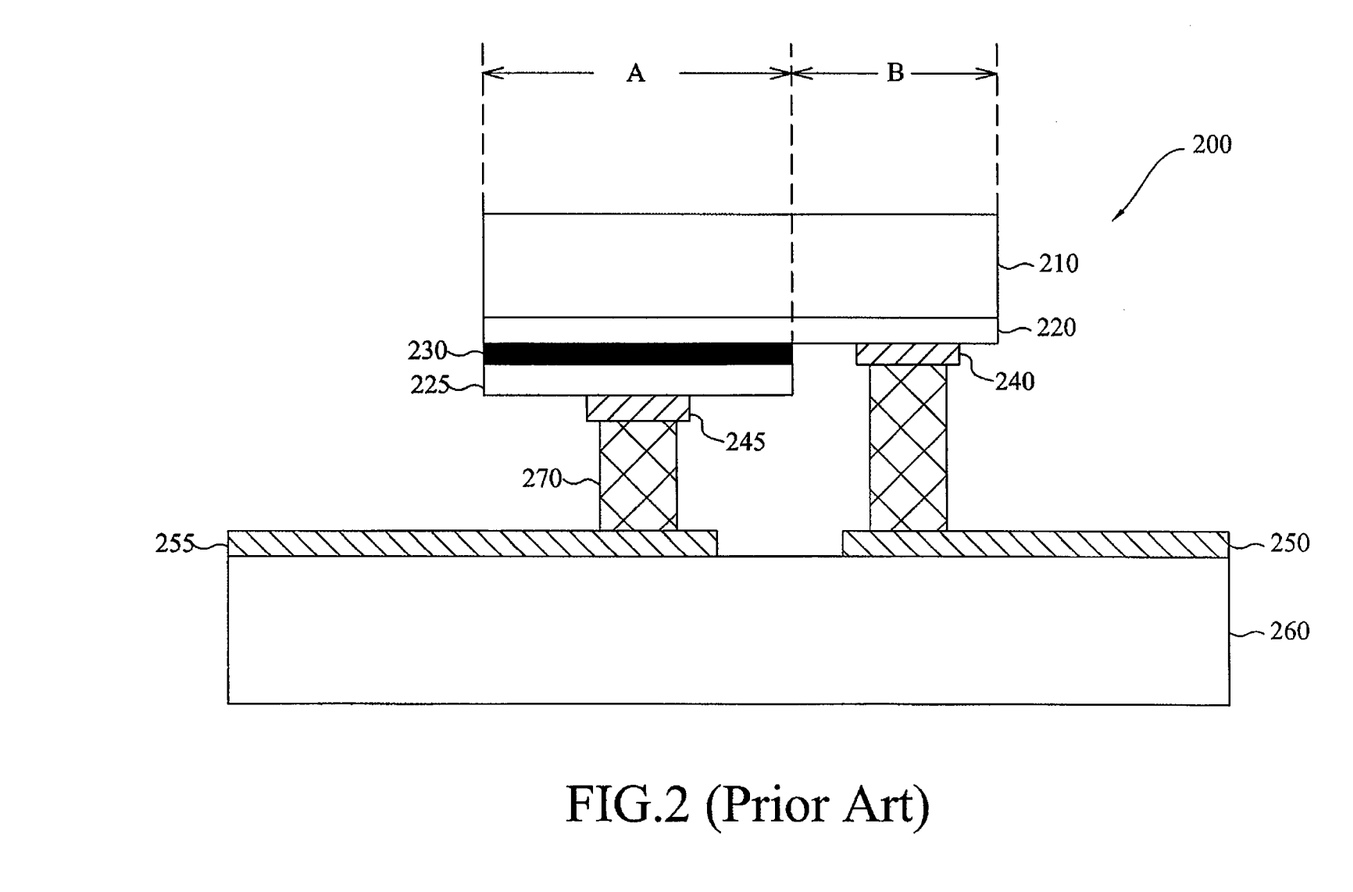
FIG. 2 is a cross-sectional diagram of a light emitting diode packaged by known flip chip packaging.

FIG. 2 is a cross-sectional diagram of a light emitting diode 200 packaged by known flip chip packaging. The light emitting diode 200 includes a transparent substrate 210, a N-type semiconductor layer 220, a light-emitting layer 230, a P-type semiconductor layer 225, and electrodes 240 and 245 being contacted with the N-type semiconductor layer 220 and P-type semiconductor layer 225 respectively. The light emitting diode 200 is connected to conductive regions 250 and 255 of the packaged base 260 by solder 270 without the need of die bonding process and/or wire bonding process.

Referring to FIG. 2, in the illuminating region A of the flip-chip light emitting diode 200, the light emitted upwardly will not be screened out by the electrode 245, such that the lighting efficiency of the flip-chip light emitting diode 200 would be better than that of the wire-bond light emitting diode 100. However, the flip-chip light emitting diode 200 still has a non-illuminating region B which typically occupies about 20 to 30 percents of the whole die size, and therefore has a limited light intensity.

Therefore, it is necessary to provide a structure and a manufacturing method for further improving luminous efficiency of the light emitting diode and method of the same.

SUMMARY OF THE INVENTION

In light of the drawbacks of the prior art, the present invention provides a light emitting diode having superior luminous efficiency and a method of the same.

According to one aspect of the present invention, a light emitting diode is provided. The light emitting diode includes a substrate having a first region and a second region, a first semiconductor layer, a light-emitting layer, a second semiconductor layer, a plurality of vias, a first metal layer, a second metal layer, and a patterned passivation layer. The first semiconductor layer is formed on the substrate, the light-emitting layer is formed on the first semiconductor layer, and the second semiconductor layer is formed on the light-emitting layer. The plurality of vias are located in the first region and penetrate through the second semiconductor layer and the light-emitting layer to expose part of the first semiconductor layer. The first metal layer is located in the first region and electrically contacted with the first semiconductor layer through the plurality of vias. The second metal layer is located in the second region, and electrically contacted with the second semiconductor layer and electrically insulated from the first metal layer. The patterned passivation layer is sandwiched in between the second semiconductor layer and the first metal layer for electrically isolating the first metal layer from the second semiconductor layer and the light-emitting layer.

According to another aspect of the present invention, a light emitting diode is provided. The light emitting diode includes a substrate having a first region and a second region, a first semiconductor layer, a light-emitting layer, a second semiconductor layer, a plurality of vias, a patterned passivation layer, a first metal layer and a second metal layer. The first semiconductor layer is formed on the substrate, the light-emitting layer is formed on the first semiconductor layer and the second semiconductor layer is formed on the light-emitting layer. The plurality of vias are located in the first region and penetrate through the second semiconductor layer and the light-emitting layer to expose part of the first semiconductor layer. The patterned passivation layer is formed on the second semiconductor layer, and the second semiconductor layer and the light-emitting layer in the first region are fully covered by the patterned passivation layer, while the second semiconductor layer in the second region is partially covered by the patterned passivation layer. The first metal layer is located in the first region and electrically contacted with the first semiconductor layer through the plurality of vias. The second metal layer is located in the second region and electrically insulated from the first metal layer.

According to still another aspect of the present invention, a method of forming a light emitting diode is provided. The method includes the following steps: providing a substrate having a first region and a second region; forming a first semiconductor layer on the substrate; forming a light-emitting layer on the first semiconductor layer; forming a second semiconductor layer on the light-emitting layer; forming a plurality of vias located in the first region and penetrating through the second semiconductor layer and the light-emitting layer to expose part of the first semiconductor layer; forming a patterned passivation layer on the second semiconductor layer, wherein the second semiconductor layer and the light-emitting layer in the first region are fully covered by the patterned passivation layer, and the second semiconductor layer in the second region is partially covered by the patterned passivation layer; forming a first metal layer in the first region to be electrically contacted with the first semiconductor layer through the plurality of vias; and forming a second metal layer in the second region to be electrically contacted with the second semiconductor layer and electrically insulated from the first metal layer.

Other aspects of the present invention would be stated and easily understood through the following description or the embodiments of the present invention. The aspects of the present invention would be appreciated and implemented by the elements and their combinations pointed out in the appended claims. It should be understood that the above summary of the invention and the following detailed description are only illustrative and are not to limit the present invention.

BRIEF DESCRIPTION OF THE PICTURES

The present invention is illustrated by way of example and not intended to be limited by the figures of the accompanying drawing, in which like notations indicate similar elements.

DETAILED DESCRIPTION OF THE INVENTION

The present invention discloses a light emitting diode and a method of the same for improving the luminous efficiency of the light emitting diode. The objects, features and advantages of the present invention may become more apparent by referring to the following description of the preferred embodiments and FIGS. 3A-4B. However, the apparatuses, elements, and steps of the method described in the following embodiments are intended to illustrate the present invention, but not to limit the scope of the invention. It should be noted that the drawings of the present application are not drawn to scale and the well-known and conventional parts have been omitted or simplified in order not to obscure an understanding of the present invention.

Each layer built on the substrate in the present invention may be formed by the methods known to one skilled in the art, such as deposition, chemical vapor deposition, or atomic layer deposition (ALD), and so on.

Figure 3A:
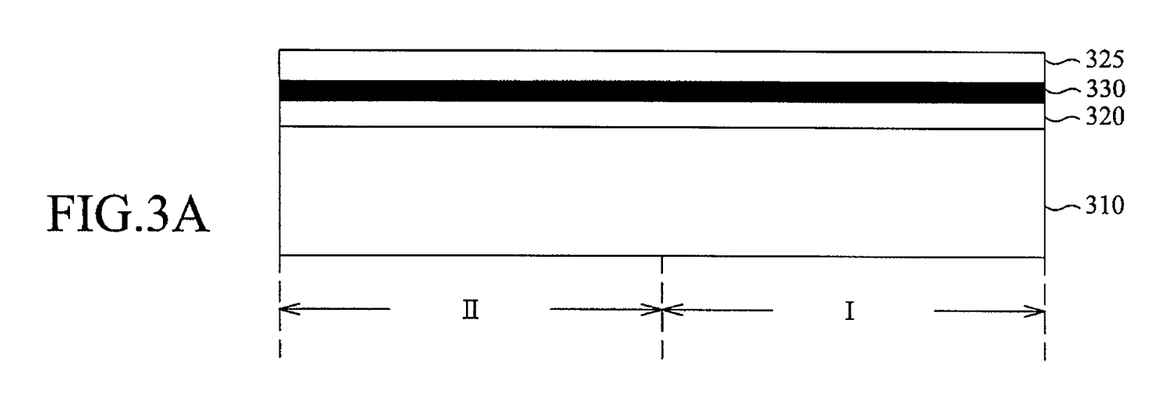
FIGS. 3A-3E, in cross-sectional views, illustrate a process of manufacturing a light emitting diode in accordance with one embodiment of the present invention.

FIGS. 3A-3E illustrate, in cross-sectional views, a process of manufacturing a light emitting diode in accordance with one embodiment of the present invention. Referring to FIG. 3A, a substrate 310 having a first region I and a second region II is provided. Next, a first semiconductor layer 320, a light-emitting layer 330, and a second semiconductor layer 325 are formed on the substrate 310, wherein the first and the second semiconductor layer 320 and 325 are doped with different type dopants. In one embodiment, the first semiconductor layer 320 is a N-type semiconductor layer, and the second semiconductor layer 325 is a P-type semiconductor layer.

Typically, the substrate 310 can be a glass substrate, a sapphire substrate, a SiC substrate, a GaP substrate, a GaAsP substrate, a ZnSe substrate, a ZnS substrate, or a ZnSSe substrate. The light-emitting layer 330 can be made of AlGaInP, InGaN or AlGaAs, and can be fabricated as a homo-structure, single heterostructure, double heterostructure (DH), multiple quantum well (MQW), or other similar conventional structures.

Figure 3B:
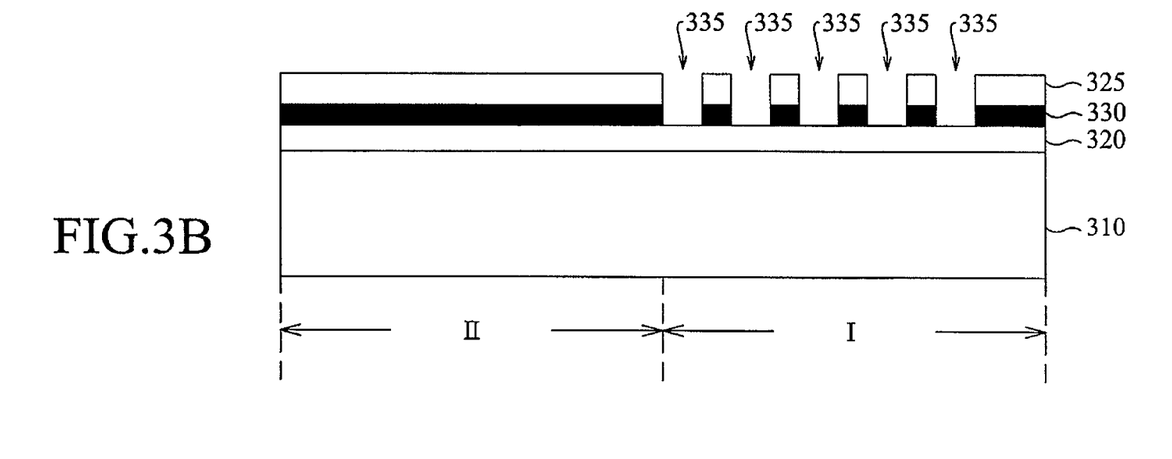

Next, as shown in FIG. 3B, part of the second semiconductor layer 325 and the light-emitting layer 330 are removed by photolithography and etching processes to form a plurality of vias 335 which expose the first semiconductor layer 320. The method of etching the second semiconductor layer 325 and the light-emitting layer 330 can be, but not limited to, reactive ion etching (RIE) or other dry etching processes. Typically, the diameter of each of the plurality of vias 335 is between about 3 µm and about 10 µm.

Figure 3C:
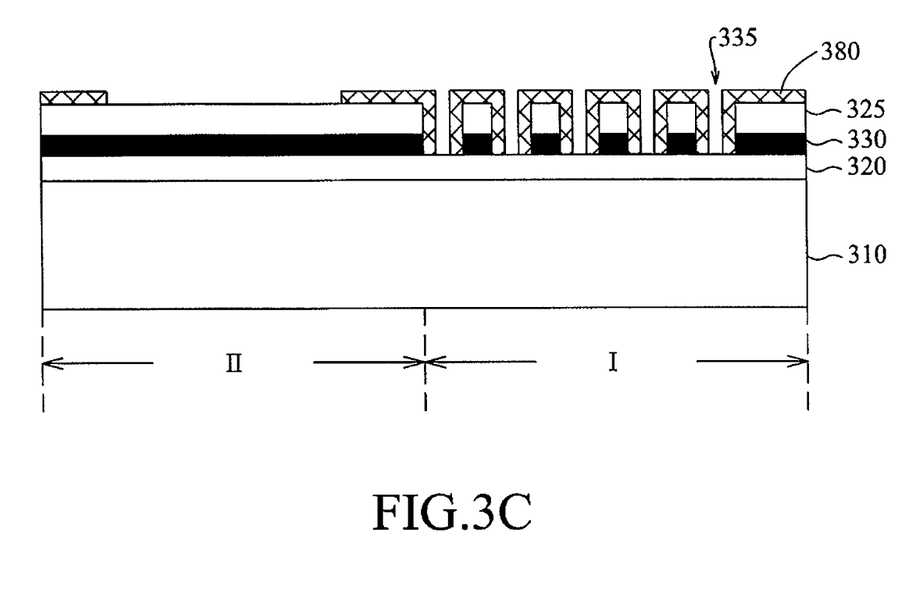

Next, referring to FIG. 3C, a patterned passivation layer 380 is formed above the substrate 310, in which the second semiconductor layer 325 and the light-emitting layer 330 in the first region I are fully covered by the patterned passivation layer 380 and the second semiconductor 325 in the second region II is partially covered by the patterned passivation layer 380. It should be noted that part of the first semiconductor layer 320 in the first region is still exposed through the plurality of the vias 335. The patterned passivation layer 380 is made of a material selected from the group consisting of $Al_2O_3$, $SiO_2$, $SiN_x$, spin-on glass (SOG), silicon resin, BCB resin, epoxy resin, polyimide, and the combinations thereof. The patterned passivation layer 380 can be formed by conventional photolithography and etching processes, which may include, for example, the steps of blanket depositing a passivation layer, coating a photoresist layer on the passivation layer, patterning the photoresist layer by a pattern transferring technique (such as exposure and development processes) to define the location of the first and the second semiconductor layers 320 and 325, and etching the passivation layer by using the patterned photoresist layer as a mask to form the patterned passivation layer 380 shown in FIG. 3C.

Figure 3D:
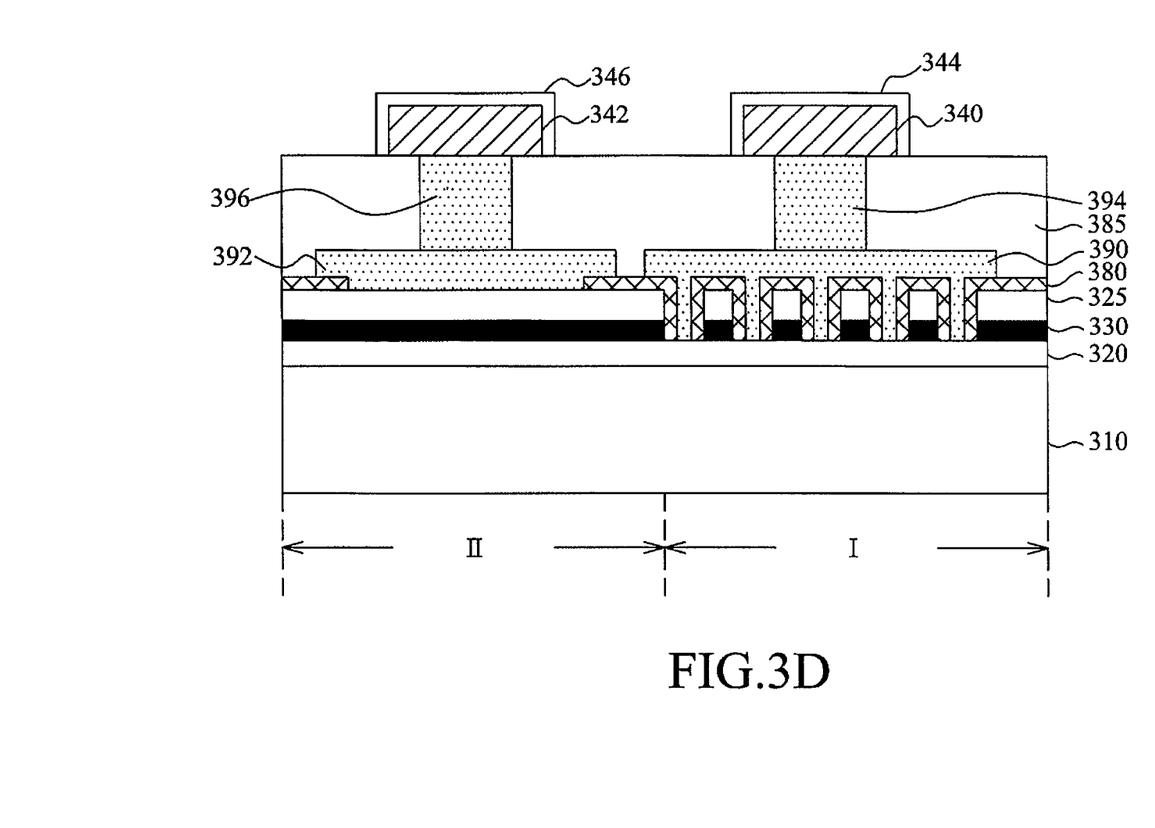

Next, referring to FIG. 3D, extended contacts 390 and 392 are formed in the first region I and the second region II respectively, which are contacted with the first semiconductor layer 320 and the second semiconductor layer 325 respectively, to extend and enlarge the external contact area. Next, inner conductive bumps 394 and 396, which can be made of any suitable conductive material, are formed on the extended contacts 390 and 392 respectively. Next, a protective layer 385 is formed on the substrate 310 to cover the patterned passivation layer 380, the extended contacts 390 and 392, and the inner conductive bumps 394 and 396. The protective layer 385 can be made of epoxy resin, polyimide, benzocycle butane, liquid crystal polymer, the combinations thereof, or any other suitable package material. It should be noted that the upper surfaces of the inner conductive bumps 394 and 396 are still exposed. In one embodiment, the structure shown in FIG. 3D can be formed by depositing a protective layer 385 by conventional semiconductor deposition process to fully cover all devices on the substrate 310, and then etching the surface of the protection layer 385 to expose the upper surfaces of the inner conductive bumps 394 and 396 by conventional polishing process (such as chemical mechanical polishing (CMP)).

Still referring to FIG. 3D, the outer conductive bumps 340 and 342 are formed above the inner conductive bumps 394 and 396 respectively, which are configured to be connected to the package substrate. The inner conductive bumps 394 and 396 and the outer conductive bumps 340 and 342 can be made of a complex mixtures of metal particles and polymer compound. Further, the outer conductive bumps 340 and 342 can be covered by surface metal layers 344 and 346, which can be made of nickel, gold, the combination thereof, or any other suitable material capable of being electrically connected to other devices.

Figure 3E:
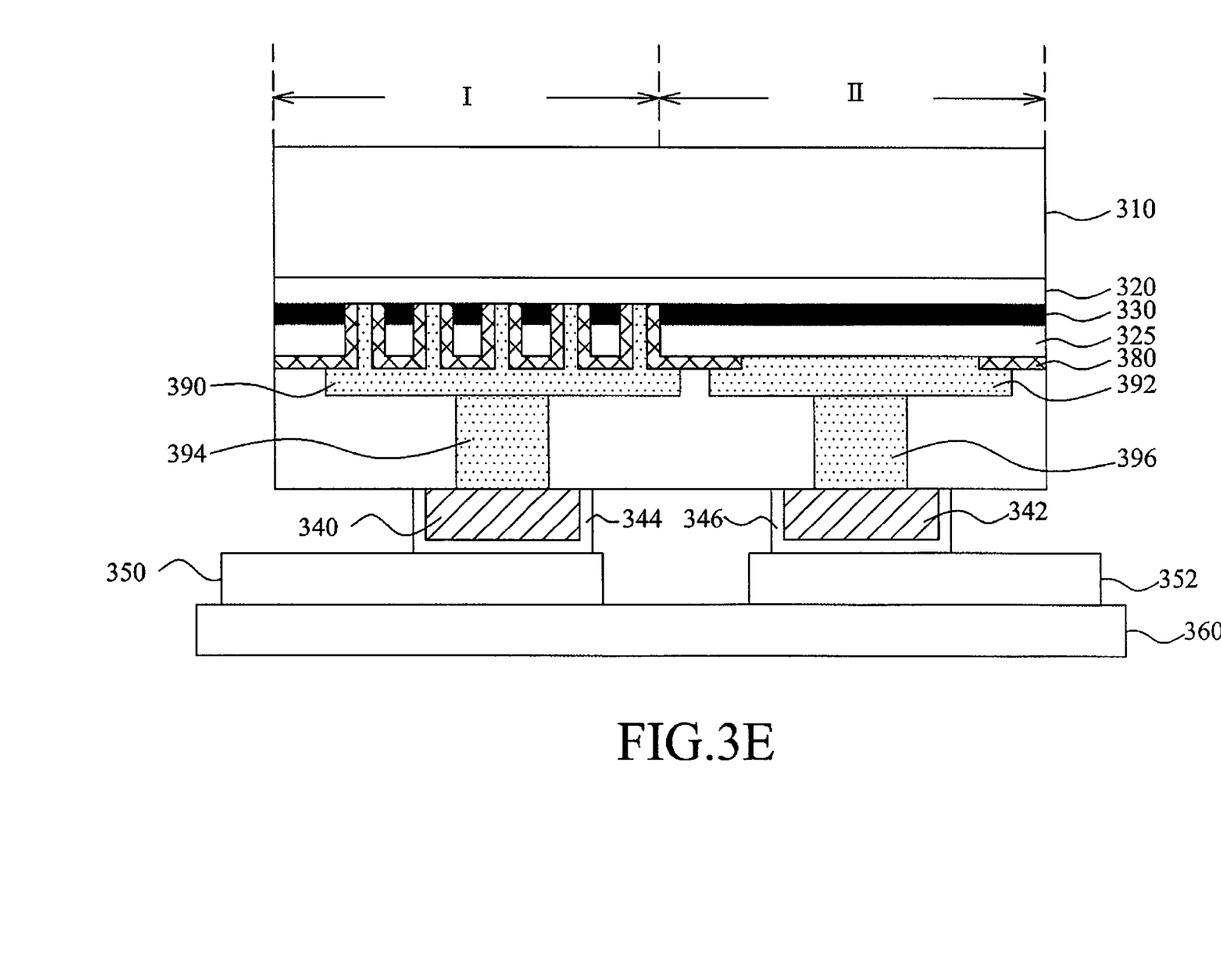

Next, referring to FIG. 3E, the flip-chip structure of the light emitting diode can be formed by inversing the structure shown in FIG. 3D and then respectively connecting the outer conductive bumps 340 and 342 to the conductive regions 350 and 352 of the base 360 by solder bumps or other suitable joint members. An exemplary method of connecting the outer conductive bumps 340 and 342 to the base 360 is the conventional flip-chip bonding technique and therefore will not be described herein.

Figure 4A:
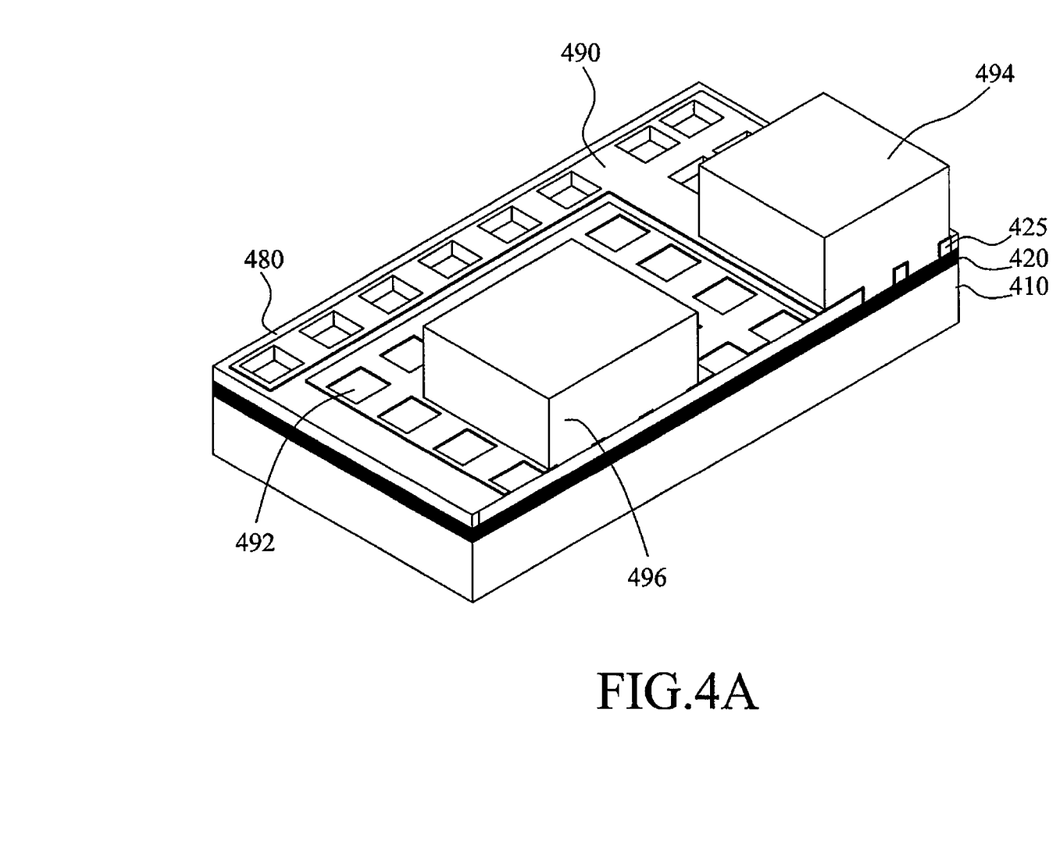
FIG. 4A-4B are two pictorial diagrams respectively illustrating two different process stages of a light emitting diode in accordance with one embodiment of the present invention.
Figure 4B:
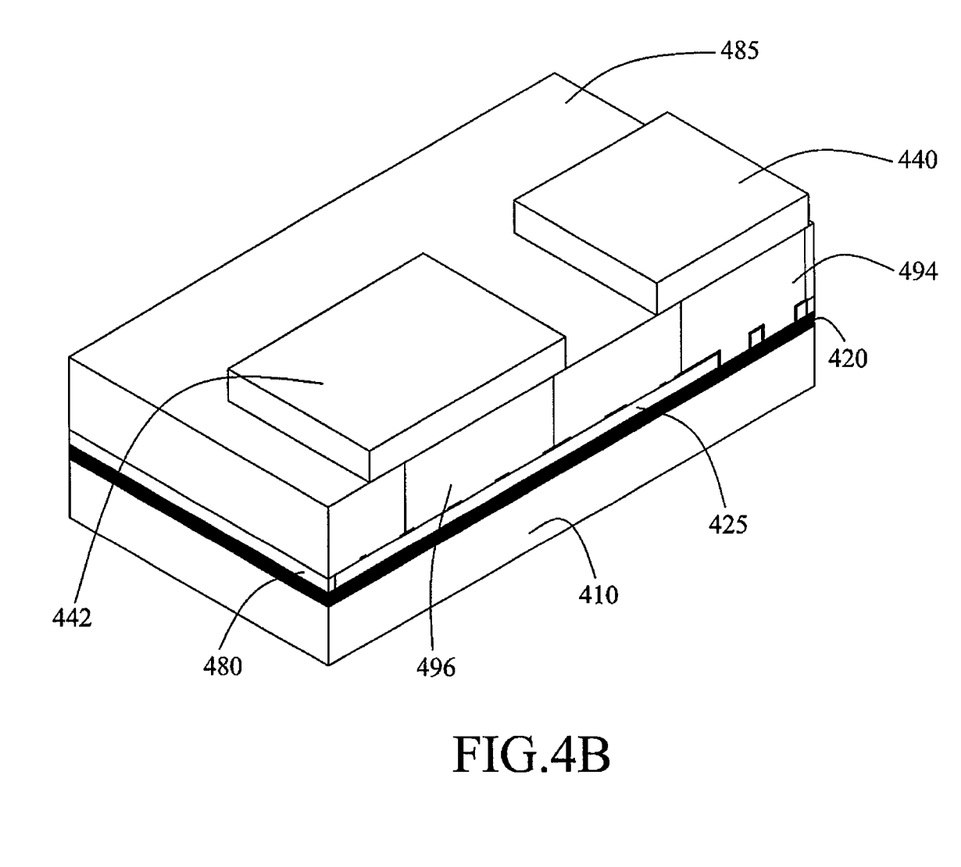

FIGS. 4A and 4B are two illustrating diagrams respectively showing two different process stages of a light emitting diode according to one embodiment of the present invention. Referring to FIG. 4A, a N-type semiconductor layer 420, a light-emitting layer (not shown), a P-type semiconductor layer 425, and a passivation layer 480 are formed sequentially, and part of the N-type semiconductor layer 420 and part of the P-type semiconductor layer 425 are exposed in different regions of the substrate 410, as shown in FIGS. 3C-3E. Next, extended contacts 490 and 492 are formed to be contacted with N-type and P-type semiconductor layers 420 and 425 respectively, and inner conductive bumps 494 and 496 are formed to be contacted with the extended contacts 490 and 492 respectively.

Next, referring to FIG. 4B, a protective layer 485 is formed on the substrate to cover the passivation layer 480 and the extended contacts 490 and 492 and surround the inner conductive bumps 494 and 496. Next, the outer conductive bumps 440 and 442 are formed on the inner conductive bumps 494 and 496 respectively and electrically connected to the N-type semiconductor layer 420 and P-type semiconductor layer 425 respectively. Finally, a flip-chip light emitting diode can be formed by inversing the structure shown in FIG. 4B and then packaging with the conventional flip chip bonding technique.

Comparing with the known light emitting diode (such as the structure shown in FIG. 2), the flip-chip light emitting diode of the present invention has a plurality of small vias providing multiple electrically conductive paths to the N-type semiconductor layer and meanwhile, most of the light-emitting layer can be retained. Therefore, there is no non-illuminating region in the light emitting diode of the present invention, such that the luminous efficiency can be significantly improved.

While this invention has been described with reference to the illustrative embodiments, these descriptions should not be construed in a limiting sense. Various modifications of the illustrative embodiment, as well as other embodiments of the invention, will be apparent upon reference to these descriptions. It is therefore contemplated that the appended claims will cover any such modifications or embodiments as falling within the true scope of the invention and its legal equivalents.

The invention claimed is:

1. A light emitting diode, comprising:
a substrate;
a first semiconductor layer on the substrate;
a light-emitting layer on the first semiconductor layer;
a second semiconductor layer on the light-emitting layer;
a plurality of vias penetrating through the second semiconductor layer and the light-emitting layer to expose part of the first semiconductor layer;
a first extended contact electrically contacted with the first semiconductor layer through the plurality of vias;
a second extended contact electrically contacted with the second semiconductor layer and electrically insulated from the first extended contact; and
only one first outer conductive bump being located on a protective layer, said only one first outer conductive bump electrically connecting to the first extended contact through only one first inner conductive bump on the first extended contact, wherein said only one first outer conductive bump is electrically contacted with the first semiconductor layer through all the plurality vias and said only one first inner conductive bump.

2. The light emitting diode of claim 1, wherein a patterned passivation layer sandwiched in between the first semiconductor layer and the second extended contact layer for electrically isolating the first extended contact layer from the second semiconductor layer and the light-emitting layer.

3. The light emitting diode of claim 2, wherein the patterned passivation layer is made of a material selected from the group consisting of Al2O3, SiO2, SiNx, spin-on glass (SOG), silicon resin, BCB resin, epoxy resin, polyimide, and the combinations thereof.

4. The light emitting diode of claim 1, wherein the protective layer covers the second extended contact and the first extended contact, and a portion of the protective layer electrically isolates the second extended contact from the first extended contact.

5. The light emitting diode of claim 4, wherein the portion of the protective layer is in contact with the patterned passivation layer.

6. The light emitting diode of claim 1, wherein each of the plurality of vias has a diameter of about 3 m to about 10 m.

7. The light emitting diode of claim 1, wherein the substrate is a transparent substrate and comprises a material selected from the group consisting of sapphire, glass, GaP, Sic, GaAsP, ZnSe, ZnS, and ZnSSe.

8. The light emitting diode of claim 1, wherein the first semiconductor layer is a N-type semiconductor layer, and the second semiconductor layer is a P-type semiconductor layer.

\* \* \* \* \*